US006754120B1

(12) United States Patent
Bellows et al.

(10) Patent No.: US 6,754,120 B1
(45) Date of Patent: Jun. 22, 2004

(54) DRAM OUTPUT CIRCUITRY SUPPORTING SEQUENTIAL DATA CAPTURE TO REDUCE CORE ACCESS TIMES

(75) Inventors: Chad Bellows, Burlingame, CA (US); Wayne Richardson, Saratoga, CA (US); Lawrence Lai, San Jose, CA (US); Kurt Knorpp, San Carlos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/364,178

(22) Filed: Feb. 11, 2003

(51) Int. Cl.[7] .............................................. G11C 7/00
(52) U.S. Cl. ...................... 365/205; 365/207; 365/208
(58) Field of Search .......................... 365/189.02, 205, 365/207, 208, 230.02, 230.06

(56) References Cited

U.S. PATENT DOCUMENTS

| 4,837,465 A | * | 6/1989 | Rubinstein .................. 365/205 |
| 5,546,346 A | * | 8/1996 | Agata et al. ................ 365/207 |
| 5,748,561 A | * | 5/1998 | Hotta ..................... 365/189.02 |
| 5,751,657 A | * | 5/1998 | Hotta ..................... 365/230.06 |
| 5,936,885 A | * | 8/1999 | Morita et al. ........... 365/185.11 |

OTHER PUBLICATIONS

"Design Optimization Techniques for Double Data Rate SDRAM Modules." Fairchild Semiconductor, Jul. 2000. 6 pages.

* cited by examiner

Primary Examiner—Trong Phan
(74) Attorney, Agent, or Firm—Silicon Edge Law Group LLP; Arthur J. Behiel

(57) ABSTRACT

Described are memory systems designed to emphasize differences between memory-cell access times. As a consequence of these access-time variations, data read from different memory cells arrives at some modified output circuitry. The output circuitry sequentially offloads the data in the order of arrival. Data access times are reduced because the output circuitry can begin shifting the first data to arrive before the slower data is ready for capture. Differences between data access times for cells in a given memory array may be emphasized using differently sized sense amplifiers, routing, or both.

36 Claims, 4 Drawing Sheets

DRAM OUTPUT CIRCUITRY SUPPORTING SEQUENTIAL DATA CAPTURE TO REDUCE CORE ACCESS TIMES

BACKGROUND

FIG. 1 (prior art) depicts memory system 100 that includes a memory core 105 connected to a serial input/output (I/O) pipeline 110. Core 105 includes an array 115 of memory cells 120, each of which connects to one of wordlines WL<0,1> and one of bitlines BL<0:15>. For example, the upper-most memory cell 120 connects to a word line WL<1> and a bitline BL<0>. The bitlines convey data signals from cells 120 to corresponding input nodes of a collection of bitline sense amplifiers 130, also called "sense amps." Sense amps 130 amplify the data signals and provide the resulting data to a read/write data line RWD within I/O pipeline 110 via complementary input/output lines I/O and I/Ob. The read/write data lines RWD<0:3> convey data both to and from array 115. Other memory systems employ separate read and write data lines. The following description is limited to read operations, for brevity, so read/write data lines RWD<0:3> are referred to as read data lines.

Each bitline sense amp 130 includes a pair of complementary output nodes that connect to pipeline 110 via a respective column-select switch 135. Column-select switches 135 divide memory array 115 into a number of columns, two in the simple example of FIG. 1. When data is being read from memory array 115, data signals presented on the read/write data lines RWD are conveyed to the input nodes of a collection of read sense amps 140. Read sense amps 140 convey the resulting amplified signals to an output register or output buffer 145. Once the data from the selected column is loaded into register 145, the contents of register 145 are shifted out via a pair of complementary data output pins DQ and DQb. Other memory systems include just one data output pin.

Memory cells 120 connect to bits 150 within output buffer 145 via routing resources that vary from one memory cell to the next. The time required for individual cells 120 to present data to output register 145 in response to a read request therefore likewise varies from one cell to the next. Due to these timing variations, output buffer 145 must await the slowest memory cell before shifting out data. In effect, the memory access time $T_{AC}$ (sometimes called the "data access time" $t_{DAC}$ or $T_{CAC}$) is limited by the speed performance of the slowest memory cell 120 within memory core 115.

Newer memory interface technologies, such as the high-speed interface from Rambus used in conjunction with Rambus Direct RDRAM memories, are capable of extracting data from memory array 115 faster than memory array 115 is able to provide data to output buffer 145. This bottleneck is expected to become more problematic in succeeding generations of high-performance memories.

SUMMARY

The present invention improves the speed at which dynamic memory systems produce data extracted from core memory. Memory systems in accordance with some embodiments are designed to emphasize differences between memory-cell access times. As a consequence of these access-time variations, data read from different memory cells arrives at some modified output circuitry. The output circuitry sequentially offloads the data in the order of arrival. Data access times are reduced because the output circuitry can begin shifting the first data to arrive before the slower data is ready for capture.

Differences between data access times for cells in a given memory array may be emphasized using differently sized sense amplifiers, routing, or both. One embodiment, for example, includes differently sized sense amplifiers to provide differently timed data-access paths.

This summary does not limit the invention, which is instead defined by the issued claims.

DETAILED DESCRIPTION

Figure 1:
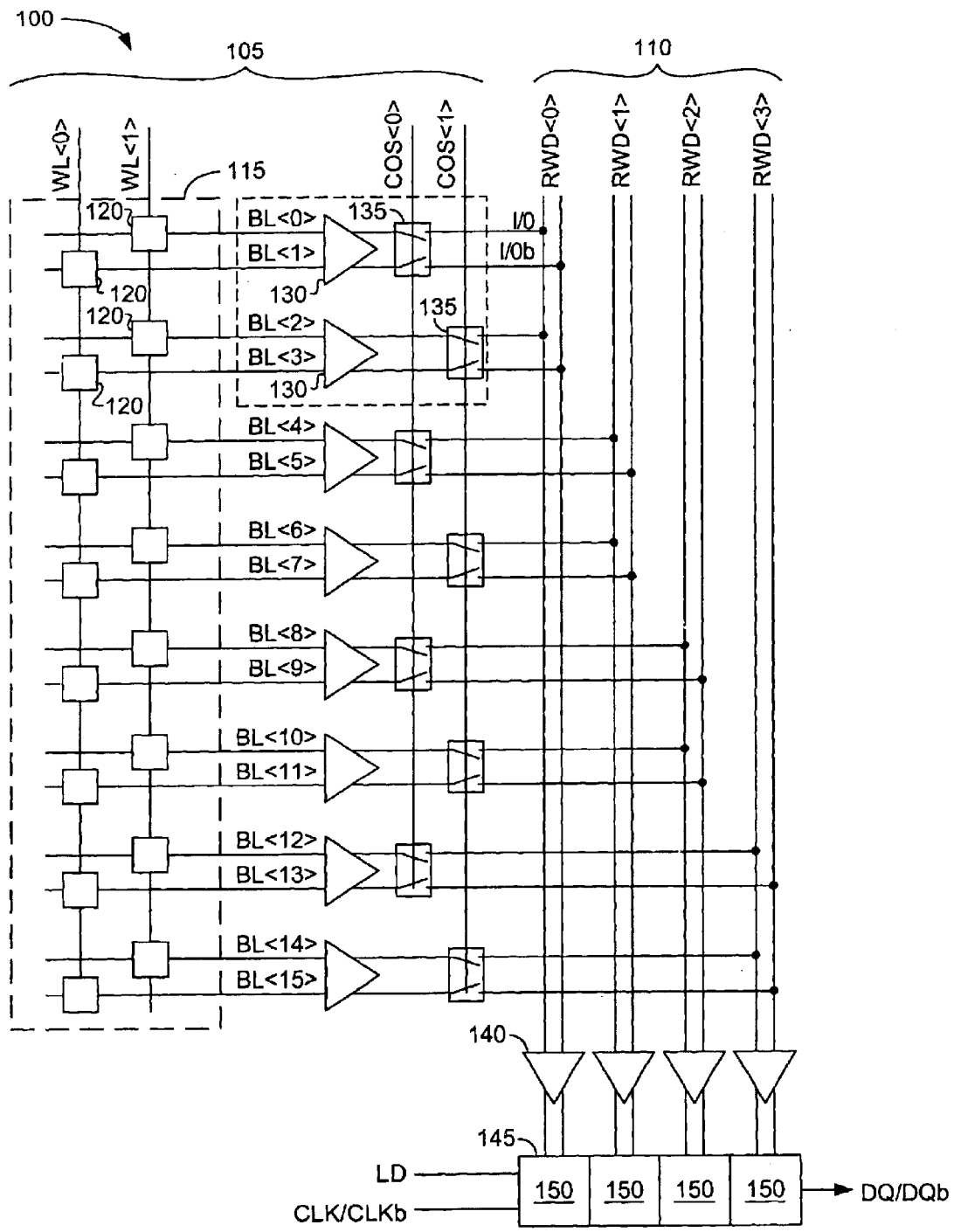
FIG. 1 (prior art) depicts memory system 100 that includes a memory core 105 connected to a serial input/output (I/O) pipeline 110.
Figure 2:
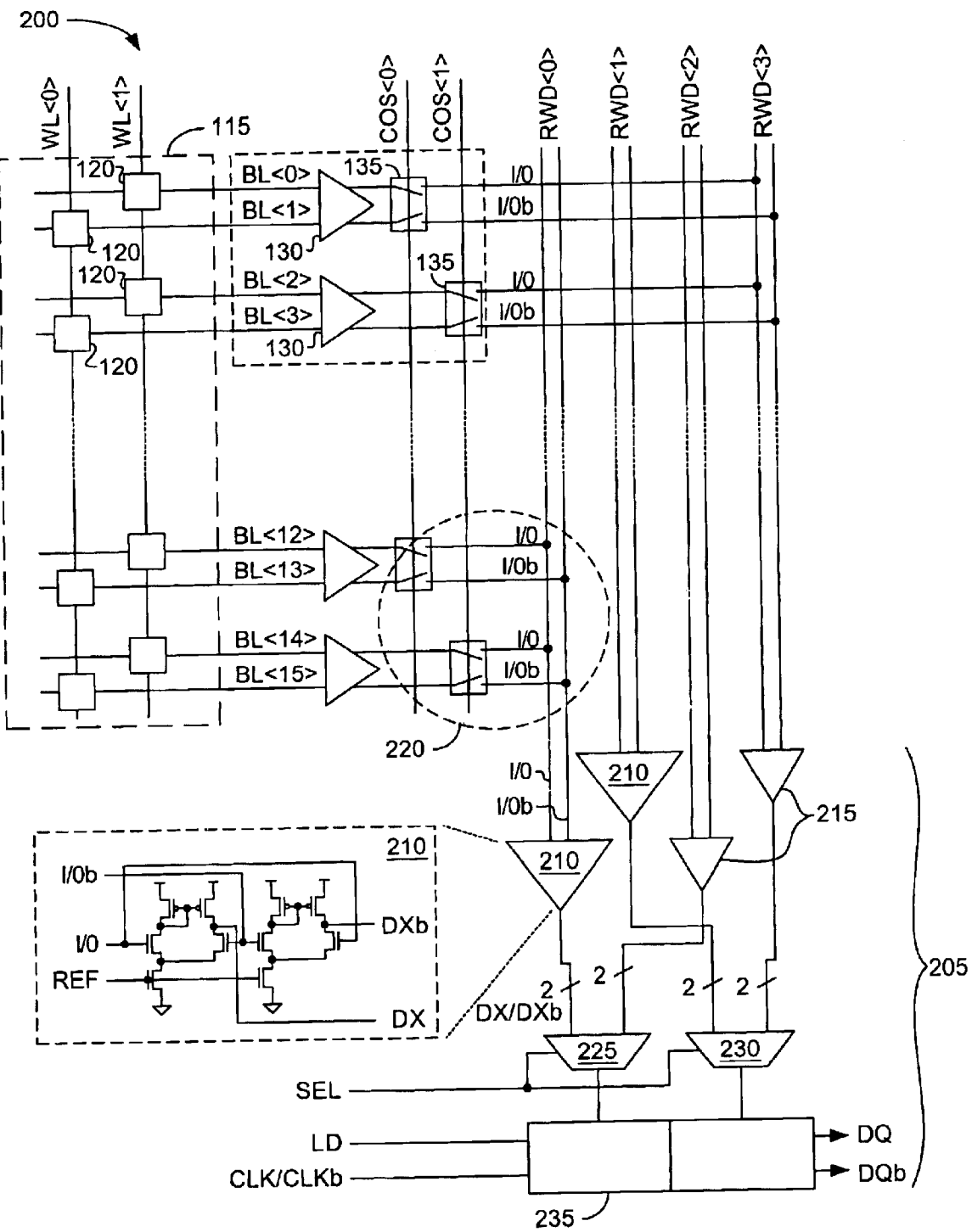
FIG. 2 depicts a high-speed memory system 200 in accordance with one embodiment of the invention.

FIG. 2 depicts a high-speed memory system 200 in accordance with one embodiment of the invention. Memory system 200 is similar in many ways to memory system 100 of FIG. 1, like-identified elements being the same or similar. Memory system 200 is modified with respect to memory system 100, however, so data read from memory core 115 intentionally arrives at output circuitry 205 within the I/O pipeline at significantly different times. Output circuitry 205 then sequentially offloads the data in the order of arrival. Data access times are reduced because output circuitry 205 begins shifting out data before the slower data is ready for capture. Differences between data access times for cells in a given memory array may be emphasized in a variety of ways, including, but not limited to, using differently sized sense amplifiers, different data-path lengths, or both. System 200 illustrates both of these approaches. Instead of four similar read sense amplifiers 140, as depicted in FIG. 1, the read sense amplifiers of memory system 200 are divided into fast sense amplifiers 210 and relatively slow sense amplifiers 215. Further, an area 220 illustrates that the data path associated with read data lines RWD<0> includes shorter I/O lines than the slower signal path associated with read data lines RWD<3>. Many other methods of altering the signal-propagation speed of a given data path may also be employed, as will be obvious to those of skill in the art. The intentional imposition of data skew to produce relatively high- and low-speed data paths is in marked contrast to the prior art of FIG. 1, in which the data paths between memory cells 120 and output buffer 145 are typically designed to minimize differences between memory-cell access times.

I/O circuit 205 includes a pair of multiplexers 225 and 230, each of which connects to a single bit of, a two-bit output register 235. Instead of waiting for both the fast and slow data to arrive at output register 235 before shifting out the data, a select line SEL to multiplexers 225 and 230 connects the output terminals of fast sense amplifiers 210 to input terminals of output register 235. A load signal LD is then asserted, causing output register 235 to capture the fast data on a subsequent edge of a differential clock signal CLK/CLKb. Output register 235 then begins shifting out the two captured bits before the slow data is ready for capture.

Once output register 235 is ready to receive the slow data, the select signal SEL changes states to connect the output terminals of the relatively slow sense amps 215 to the input terminals of output register 235. The slow data is then captured and shifted out in the same manner as the fast data. Allowing output register 235 to begin shifting out data before all of the data is available from array 115 advantageously reduces the data access time of memory system 200.

FIG. 2 includes a simplified, transistor-level diagram of one example of a fast read sense amplifier that may be used as read sense amplifier 210. Other read sense amplifiers may be used in other embodiments. As depicted in FIG. 2, read sense amplifiers 210 and 215 amplify differential input signals on differential input terminals I/O and I/Ob and produce amplified differential output signals on differential output terminals DX and DXb. This simple example includes PMOS load transistors, NMOS input transistors, and NMOS current sources connected to a reference terminal REF (sense amplifiers for use in modern high-speed memory systems include additional components, as is well known in the art). The switching speed of sense amplifiers 210 may be increased and/or the speed of sense amplifiers 215 may be decreased to increase the access-time differential between memory cells coupled to read sense amplifiers 210 and those coupled to read sense amplifiers 215. As a first order approximation, the switching speed of sense amplifiers 210 is proportional to the ratio of the gate width W to the gate length L of the constituent transistors (i.e., switching speed is proportional to W/L); thus, increasing the width (or reducing the length) increases the switching speed. The same relationships hold for sense amps 215 and 130.

The following table 1 illustrates the relationship between transistor width W, average current $I_A$, and speed (input-to-output delay) for an embodiment of sense amplifier 210 employing transistors of length L=0.14 um.

TABLE 1

| Transistor width W | Switching Speed | Average Current $I_A$ |
|---|---|---|
| 0.15 um | 250 ps | 20 uA |
| 0.2 um | 200 ps | 30 uA |
| 0.3 um | 180 ps | 40 uA |
| 1.0 um | 130 ps | 70 uA |
| 5.0 um | 110 ps | 90 uA |

The relationship between width and speed is not linear. As evident in Table 1, a 6.7× width increase (from 0.15 um to 1.0 um) almost doubles the switching speed (i.e., almost halves the switching delay), while a further 5× width increase (from 1.0 um to 5.0 um) increases the switching speed by only about fifteen percent. In any case, sense amplifiers 210 can be made substantially faster (e.g., more than fifteen percent faster) than sense amplifiers 215 by selecting appropriate widths. In some embodiments, the fast data paths include sense amplifiers that switch more than twice as fast as those associated with the slow data paths. These substantial speed differences are greater than expected of similar sense amplifiers on a given IC mismatched due to process variations. Also evident in Table 1, increased speed performance comes with a cost of higher current, and consequently reduced efficiency and increased noise.

In the depicted embodiment, the transistors within sense amplifiers 210 have a higher width-to-length ratio W/L as compared with the transistors (not shown) within amplifier 215. The degree to which differences in W/L ratios produce differences in speed performance depends upon a number of factors relating to the process selected to form the transistors. In one embodiment, the W/L ratios of the fast and slow sense amplifiers differ by at least twenty percent to achieve a desired difference in speed performance. Still larger W/L-ratio disparities (e.g., greater than 100%) are expected to produce desired differences in switching speeds. In the example of Table 1, a 50× width increase, with length L held constant, increases switching speed by a factor of approximately three.

Enhancing differences between memory-cell access times and sequentially reading out the resulting fast and slow data has the added benefit of reducing noise. If all of sense amplifiers 210 and 215 simultaneously draw their maximum read currents, then the resulting combined current spike can introduce undesirable noise. This effect is enhanced if relatively large sense amplifiers are employed for speed performance. Varying the arrival times of the data to the sense amplifiers and reducing the number of high-current sense amplifiers reduces the peak current drawn from the power supply, and thus reduces the combined noise spike. Moreover, the sense amplifiers used to access the relatively slow data can be made small to save power and further reduce noise. In some embodiments, bitline sense amplifiers 130 are modified to skew the arrival of data to read sense amplifiers 210 and 215.

Figure 3:
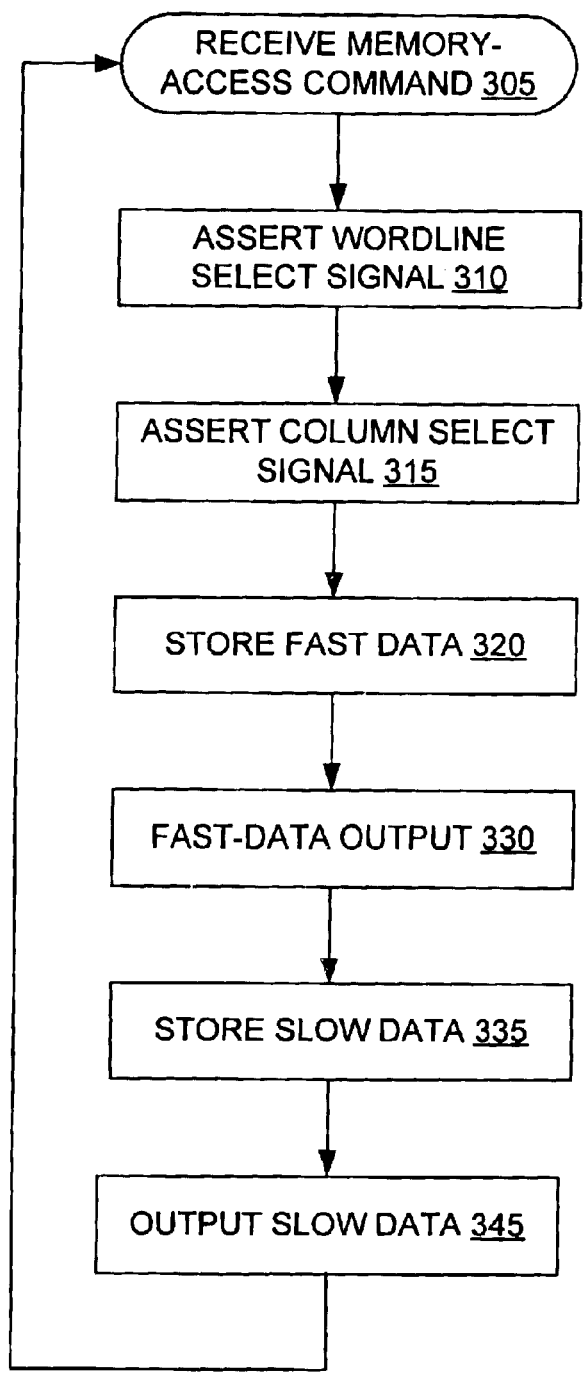
FIG. 3 depicts a flow chart 300 illustrating the operation of memory system 200 in accordance with one embodiment.

FIG. 3 depicts a flowchart 300 illustrating the operation of memory system 200 of FIG. 2 in accordance with one embodiment. First, though not shown, some portion of memory system 200 receives a conventional memory access command (step 305). Conventional control circuitry, also not shown, then asserts a wordline signal on one of wordlines WL<0,1> to select a subset of memory cells 120 for reading (step 310). With the wordline select signal still asserted, the control circuitry asserts a column select signal on one of lines COS<0> and COS<1> (step 315). The wordline-select signal conveys the contents of those memory cells 120 that intersect the selected wordline to sense amplifiers 130. The column-select signal connects a subset of sense amplifiers 130 to read/write data lines RWD<0:3> via switches 135. Data from those memory cells 120 associated with the fast data paths (i.e., the "fast data") arrives first at the inputs of multiplexers 225 and 230, and also to output register 235. The load and clock signals LD and CLK/CLKb load the fast data into output register 235 (step 320). During this time, the slow data is traversing relatively slow data paths, including read sense amps 215. Before the slow data is ready to load, output register 235 begins shifting out the fast data on output pins DQ and DQb. Pin DQb is not essential to the invention, as most implementations will not use differential outputs (too many pins) (step 330). Once output register 235 is ready to receive new data, select signal SEL changes state to provide the slow data from sense amplifiers 215 to the input terminals of output register 235 (step 335). Once loaded, output register 235 shifts out the slow data on pins DQ and DQb (step 345).

Figure 4:
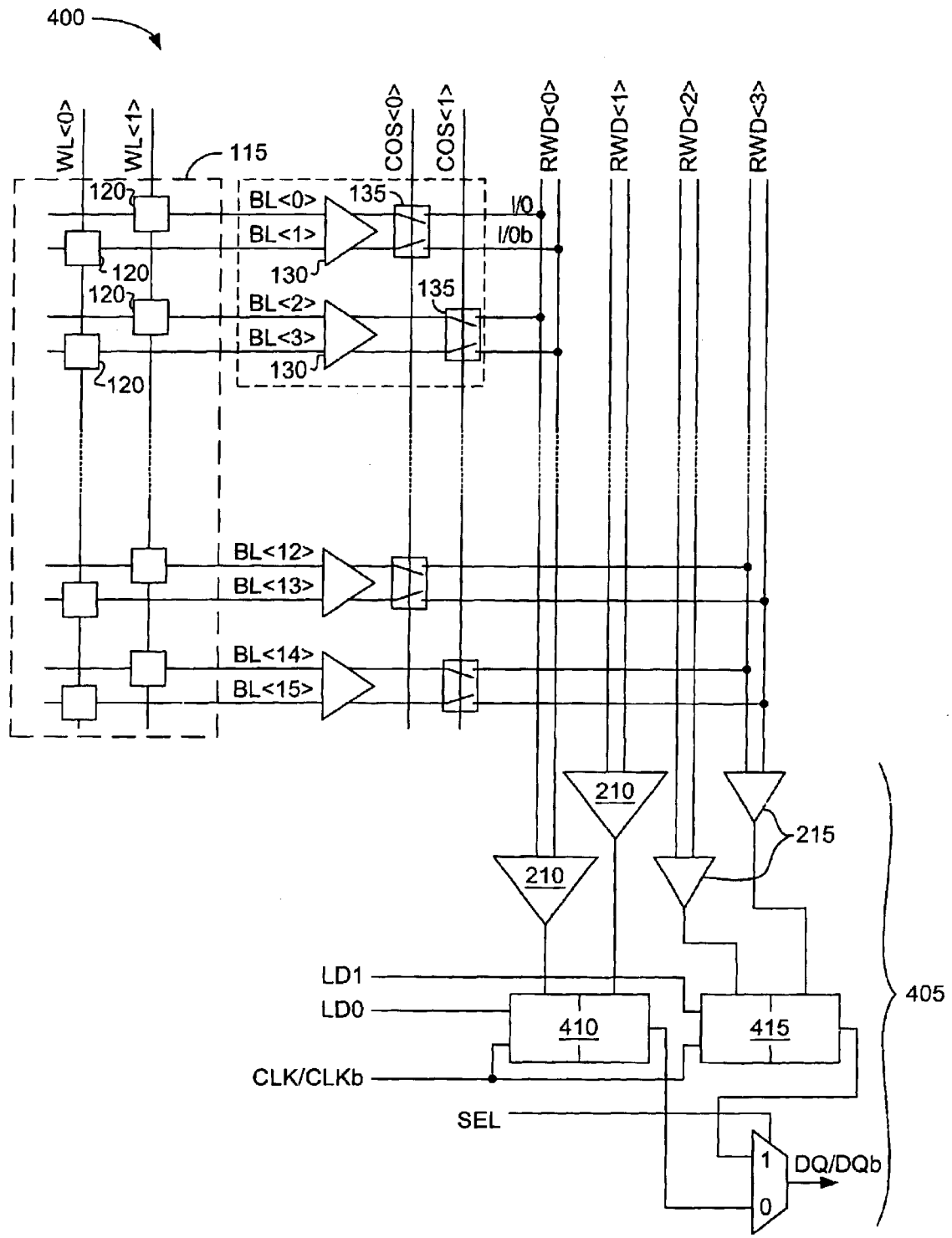
FIG. 4 depicts a memory system 400 in accordance with another embodiment.

FIG. 4 depicts a memory system 400 in accordance with another embodiment. Memory system 400 is similar to memory system 200 of FIG. 2, like-identified elements being the same or similar. Memory system 400 differs from memory system 200 in that the I/O circuitry 405 is modified so the fast and slow data are loaded into a pair of output registers 410 and 415 at separate instants, as directed by a pair of load-control terminals LD0 and LD1; the output terminals of registers 410 and 415 are then multiplexed to provide output data on pins DQ and DQb.

The memory systems depicted above have been greatly simplified for ease and illustration. A typical memory system includes millions of memory cells and many more columns and rows than are depicted. One embodiment, for example, supports a DRAM architecture that includes an 8-bit I/O pipeline. This 8-bit I/O pipeline can be divided in accordance with some embodiments into two 4-bit portions, four 2-bit portions, or eight 1-bit portions. The manner in which the output data is divided will depend upon the requirements of a given system.

DRAM designers will optimize their architectures for speed, power, and area. The present invention improves speed performance by eliminating the dependency of the output on the slowest memory-cell access path in a memory array. The invention also addresses power concerns by using relatively small and efficient sense amps in areas that do not require maximum speed. As to real estate, the smaller sense amps employ smaller transistors, and consequently require less area to implement. A given design will, in taking advantage of the flexibility provided by embodiments of the invention, balance the needs for speed, reduced real estate, and reduced power consumption.

The foregoing embodiments emphasize speed differences between internal memory-cell access times to improve external memory-access times. It may be advantageous, in some embodiments, to minimize differences between internal memory-access times; in such cases, differently sized sense amplifiers can be employed to enhance relatively slow signal paths, retard relatively fast signal paths, or both. In some such embodiments, two or more collections of data arrive at one or more output registers at different times, but the data within each collection arrive substantially simultaneously.

While the present invention has been described in connection with specific embodiments, variations of these embodiments will be obvious to those of ordinary skill in the art. Moreover, some components are shown directly connected to one another while others are shown connected via intermediate components. In each instance the method of interconnection establishes some desired electrical communication between two or more circuit nodes (e.g., lines or terminals). Such communication may often be accomplished using a number of circuit configurations, as will be understood by those of skill in the art. Therefore, the spirit and scope of the appended claims should not be limited to the foregoing description.

What is claimed is:

1. A memory comprising:
   a. a memory array, including a plurality of memory cells;
   b. a plurality of bitlines, each bitline connected to at least one of the memory cells;
   c. a plurality of bitline sense amplifiers, each of the bitline sense amplifiers having:
      i. a bitline-sense-amplifier input node connected to one of the bitlines; and
      ii. a bitline-sense-amplifier output node;
   d. a plurality of read data lines, each read data line connected to one of the bitline-sense-amplifier output nodes;
   e. a first read sense amplifier having a first read-sense-amplifier input node connected to a first of the memory read lines, wherein the first read sense amplifier exhibits a first switching speed; and
   f. a second read sense amplifier having a second read-sense-amplifier input node connected to a second of the memory read lines, wherein the second read-sense amplifier exhibits a second switching speed, and wherein the first switching speed is more than fifteen percent faster than the second switching speed.

2. The memory of claim 1, further comprising column-select circuitry disposed between the read data lines and the bitlines.

3. The memory of claim 1, wherein the first read sense amplifier includes a first input transistor having a first width-to-length ratio and the second read sense amplifier includes a second input transistor having a second width-to-length ratio less than the first width-to-length ratio.

4. The memory of claim 3, wherein the first width-to-length ratio is at least twice the second width-to-length ratio.

5. The memory of claim 1, wherein the memory cells are dynamic memory cells.

6. The memory of claim 1, further comprising a first output register connected to the first read sense amplifier and a second output register connected to the second read sense amplifier.

7. The memory of claim 6, wherein the first output register connects to the first read sense amplifier via a first multiplexer, and wherein the second output register connects to the second read sense amplifier via a second multiplexer.

8. The memory of claim 1, wherein the memory read lines are read/write data lines.

9. The memory of claim 1, wherein the first switching speed is more than double the second switching speed.

10. A memory comprising:
    a. a memory core having a plurality of memory cells, each memory cell selectively connected to one of a plurality of memory read lines;
    b. a first output register connected to a first subset of the memory read lines and having a first register output terminal;
    c. a data output pin connected to the first register output terminal; and
    d. a second output register connected to a second subset of the memory read lines and having a second register output terminal connected to the data output pin.

11. The memory of claim 10, wherein the first output register stores first data on the first subset of the memory read lines at a first instant and the second output register stores second data on the second subset of the memory read lines at a second instant.

12. The memory of claim 11, wherein the first and second output registers store the respective first and second data in response to a single memory-access request.

13. The memory of claim 10, wherein the first subset of the read lines includes more than one read line.

14. The memory of claim 10, wherein the first output register connects to the at least one output pin via a multiplexer, and wherein the second output register connects to the at least one output pin via the multiplexer.

15. The memory of claim 10, wherein the read lines convey data to and from the memory cells.

16. The memory of claim 10, further comprising:
    a. a first read sense amplifier connected between the first subset of the memory read lines and the first output register; and
    b. a second read sense amplifier connected between the second subset of the memory read lines and the first output register.

17. The memory of claim 16, wherein the first read-sense amplifier exhibits a first switching speed and the second read-sense amplifier exhibits a second switching speed substantially less than the first switching speed.

18. The memory of claim 16, wherein the first read sense amplifier includes a first input transistor having a first width-to-length ratio and the second read sense amplifier includes a second input transistor having a second width-to-length ratio less than the first width-to-length ratio.

19. The memory of claim 18, further comprising at least one output pin, wherein the first and second output registers alternately present data on the at least one output pin.

20. The memory of claim 19, wherein the first and second output registers present the data on the at least one output pin during a single memory access.

21. The memory of claim 10:
   a. wherein the first output register connects to a first subset of the plurality of memory cells via a first collection of data paths having a first average length, the first collection of data paths including the first subset of the memory lines; and
   b. wherein the second output register connects to a second subset of the plurality of memory cells via a second collection of data paths having a second average length greater than the first average length, the second collection of data paths including the second subset of the memory lines.

22. A method of reading data from memory cells within a memory, the method comprising:
   a. receiving a memory-access command specifying a first plurality of memory cells, wherein the memory cells have data stored within;
   b. responding to the memory-access command by:
      i. asserting a wordline select signal to convey the data in the first plurality of memory cells to a collection of data lines, wherein a first subset of the data arrives on a first subset of the data lines before a second subset of the data arrives on a second subset of the data lines;
      ii. storing, at a first instant, the first subset of the data; and
      iii. storing, at a second instant subsequent to the first instant, the second subset of the data.

23. The method of claim 22, wherein the second subset of the data arrives on the second subset of data lines between the first and second instants.

24. The method of claim 22, further comprising sequentially providing, from the memory, the first subset of data and the second subset of data.

25. The method of claim 22, wherein the first subset of data is stored in a register at the first instant, the method further comprising beginning to convey the stored first subset of the data from the register before the second instant.

26. The method of claim 25, wherein the second subset of data is stored in a second register at the second instant, the method further comprising beginning to convey the stored second subset of the data from the second register after all the stored first subset of the data is conveyed from the first-mentioned register.

27. The method of claim 22, wherein the first and second subsets of the data are stored consecutively in a memory output register in response to the memory access command.

28. A memory comprising:
   a. a memory array, including a plurality of memory cells;
   b. a data output pin;
   c. at least one output register connected to the data output pin;
   d. a plurality of high-speed data paths selectively connected between a first collection of the plurality of memory cells and the at least one output register, the high-speed data paths conveying fast data from the memory array to the at least one output register; and
   e. a plurality of low-speed data paths selectively connected between a second collection of the plurality of memory cells and the at least one output register, the low-speed data paths conveying slow data from the memory array to the at least one output register;
   f. wherein the at least one output register captures the fast data before the slow data.

29. The memory of claim 28, the at least on output register including a first output register and a second output register, where the first output register captures the fast data and the second output register captures the slow data.

30. The memory of claim 28, wherein the at least one output register produces at least one bit of the fast data on the data output pin before capturing the slow data.

31. The memory of claim 28:
   g. wherein at least one of the high-speed data paths includes a first sense amplifier exhibiting a first switching speed;
   h. wherein at least one of the low-speed data paths includes a second sense amplifier exhibiting a second switching speed; and
   i. wherein the first switching speed is more than fifteen percent faster than the second switching speed.

32. A memory comprising:
   a. a memory array, including a plurality of memory cells;
   b. a plurality of read data lines, each read data line selectively connected to ones of the memory cells;
   c. a first read sense amplifier having a first read-sense-amplifier input node connected to a first of the memory read lines, wherein the first read sense amplifier exhibits a first switching speed; and
   d. a second read sense amplifier having a second read-sense-amplifier input node connected to a second of the memory read lines, wherein the second read-sense amplifier exhibits a second switching speed, and wherein the first switching speed is more than fifteen percent faster than the second switching speed.

33. The memory of claim 32, wherein the first read sense amplifier includes a first input transistor having a first width-to-length ratio and the second read sense amplifier includes a second input transistor having a second width-to-length ratio different from the first width-to-length ratio.

34. The memory of claim 33, wherein the first width-to-length ratio is at least twice the second width-to-length ratio.

35. The memory of claim 32:
   a. wherein the first read sense amplifier is a first portion of a first data path exhibiting a first propagation delay;
   b. wherein the second read sense amplifier is a second portion of a second data path exhibiting a second propagation delay; and
   c. wherein the first and second propagation delays are substantially equal.

36. The memory of claim 35, wherein the first and second propagation delays differ by less than fifteen percent.

* * * * *